219-121 SR

OR 3,294,951

Rm 219/121 EM

Dec. 27, 1966 K. O. OLSON 3,294,951

MICRO-SOLDERING

Filed April 30, 1963

INVENTOR
KALMAR O. OLSON
BY [signature]
ATTORNEY

United States Patent Office 3,294,951

Patented Dec. 27, 1966

3,294,951
MICRO-SOLDERING

Kalmar O. Olson, Windsor Locks, Conn., assignor to United Aircraft Corporation, East Hartford, Conn., a corporation of Delaware Filed Apr. 30, 1963, Ser. No. 276,877
10 Claims. (Cl. 219—117)

This invention relates to a novel method of soldering. More particularly, this invention is directed to the fabrication of microminiaturized electronic circuits by means of soldering individual active and passive circuit components to terminal pads on circuit boards.

One continuous and consistent trend in the history of electronics has been the reduction in the size and weight of the assembly needed for any particular electronic function. Today, the term generally applied to this trend is microminiaturization. Microminiaturized electronic devices are, as a general rule, comprised of a plurality of miniaturized circuits sometimes known as micromodules. These micromodules are comprised of one or more circuit boards which have conductive paths and thin film passive elements formed thereon by any of the well-known printed circuit or vapor deposition processes. It is, of course, necessary to mount on these circuit boards active and passive circuit components which cannot be fabricated by thin film techniques. That is, it is now and probably will remain impossible to create components such as precise temperature independent resistors, nonvoltage dependent capacitors, and certain types of semiconductor devices by vapor deposition or other thin film techniques. There has, therefore, been intensive investigation in recent years to find a method of attaching in an economical and practical manner these individual circuit components to circuit boards. The magnitude of the problem presented may be understood when it is realized that the leads extending from a typical microminiaturized circuit component may take the form of copper ribbons having dimensions of .002 x .010 inch. In a complex electronic device it may be necessary to join thousands of leads or ribbons of this size to terminal pads on circuit boards. The joining method must be such that it will provide maximum reliability, permit a high density of circuit components, and extreme care must be taken not to overheat nearby circuit components. The latter requirement is of particular importance where the leads from semiconductor devices are to be joined to terminal pads .

In the prior art, there are several methods for fabricating micromodules. The oldest and probably the least reliable method is soldering the leads from the individual components to the terminal pads by means of a small soldering iron. This method has the obvious disadvantage of being slow and, due to the size of even the smallest iron, it is impractical to attempt to attach leads by this method where high component density is desired. Another method utilized in the prior art is the dip soldering of micromodules by means of a flow solder process. This method has been all but abandoned in the art since it exposes the circuit components to high temperatures and possible damage. Also, this method is not practical for high component density configurations where the leads are extremely closely spaced since the solder would not drain off between the leads. To avoid the soldering processes, which in recent years have been unacceptable for the fabrication of many devices because of the possibility of cold solder joints, resort was made to resistance welding techniques. Resistance welding, like the use of a soldering iron, is slow and is hampered by size limitations on the joining tool. Further, with resistance welding, there is a danger of discharging high electric currents through the circuit components. Recently, component leads and riser wires on micromodules have been joined to terminal pads by means of electron beam welding. This method is superior to the preceeding methods in that it can be set up in a programmed and automated welding process and the joining is accomplished in a very short time thereby reducing the possibility of thermal damage to the circuit components. Also, with electron beam welding, there is no danger of discharging high currents through the circuit components. However, electron beam welding suffers from the disadvantage that it requires very high heat energy which, although localized, anneals the copper leads and tends to damage the terminal pads. Also, electron beam welding cannot be utilized forthe joining of components to polymeric circuit boards because the high temperatures produced in the weld region will damage the boards. Thus, electron beam welding has been limited to use where ceramic circuit boards are employed.

This invention overcomes the above-mentioned disadvantages of the prior art joining methods and provides a novel process for joining two metallic members.

It is therefore an object of this invention to provide an improved method of joining metallic members.

It is another object of this invention to provide a novel method of soldering.

It is also an object of this invention to fabricate microminiaturized electronic circuits.

It is yet another object of this invention to join the leads on electronic circuit components to terminal pads on circuit boards.

These and other objects of this invention are accomplished by utilizing a highly energized beam as a soldering tool. Specifically, the foregoing objects are accomplished by coating a first member to be soldered with a low melting point conductive material. The energized beam is then caused to impinge upon the second member to be soldered and the beam intensity is controlled so that the beam will drill a hole in the second member and will melt the coating on the first member. Due to capillary action, coating material then flows up the hole drilled by the beam and wets both surfaces of the second member thereby providing an extremely strong bond.

This invention may be better understood and its numerous advantages will become apparent to those skilled in the art by reference to the accompanying drawing wherein like reference numerals apply to like elements in the various figures and in which.

Figures 1, 2, 3, 4, 5, 6, 7:
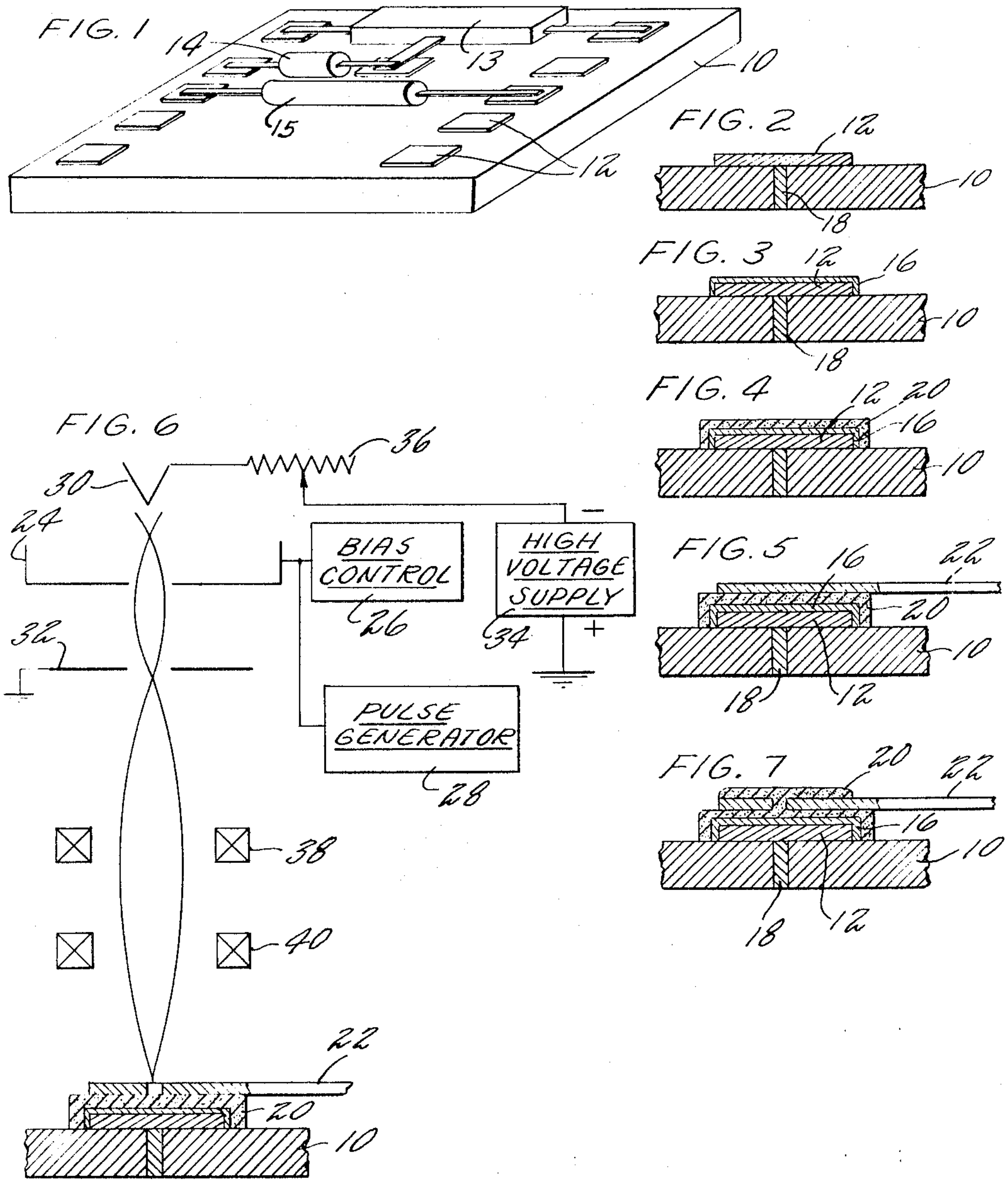
FIGURE 1 depicts a circuit board with a plurality of individual electronic circuit components positioned thereon for joining to metalized contact pads.
FIGURES 2 through 6 depict the various steps to be performed in the practice of the method of this invention.
FIGURE 7 shows a finished joint made in accordance with this invention.

As mentioned above, electron beam welding of the leads of electronic circuit components to terminal pads on circuit boards is the most advantageous of the prior art joining processes. The foregoing is true because the electron beam as a tool can be easily controlled since it may be readily focused, its power simply adjusted, and it may be electrically deflected to a desired point. Also, a beam of electrons is extremely pure in the chemical sense in that it possesses no contaminates and, since working with an electron beam is usually performed in a vacuum, the possibility of contamination of the workpiece is virtually eliminated. Another advantage realized through the use of electron beam techniques is that they eliminate the requirement, imposed by standard resistance welding techniques, of providing return paths for electric currents from the weld area. Further, an electron beam joining process can be performed without any danger of thermal damage to nearby semiconductor elements since the fusion bond produced by the beam may be made in an extremely short time with a high energy utilization factor. Thus, it would be highly desirable to retain the electron beam as a tool in any improved joining processes. However, as noted above, there are certain disadvantages of electron beam welding must be overcome. This invention overcomes these above-mentioned disadvantages and also overcomes the disadvantages inherent in prior art soldering methods and thus takes advantage of the desirable features of both processes.

In order to obtain the advantages inherent in using the electron beam as a tool, the electron beam generator utilized must be a precision instrument capable of providing a highly focused electron beam. U.S. Patent No. 2,987,610, issued June 6, 1961, to K. H. Steigerwald, discloses such an electron beam machine. Machines such as those shown in the Steigerwald patent are capable of providing electron beams having a power density of from $10^7$ to $10^9$ watts per square inch with a beam diameter of .0005 inch. As is now well known, electron beam machines are devices which use the kinetic energy of an electron beam to work a material. The electron beam is a tool which has practically no mass but has high kinetic energy because of the extremely high velocity imparted to the electrons. Transfer of this kinetic energy to the lattice electrons of the workpiece generates higher lattice vibrations which cause an increase in the temperature within the impingement area sufficient to accomplish work. By selection and then proper adjustment of the D.C. acceleration voltage applied between the cathode and apertured anode of the electron beam generator, which voltage accelerates the beam of electrons towards the workpiece; the bias voltage applied between the cathode and a control electrode positioned between the cathode and anode, which voltage controls the number of electrons in the beam; and the current to a magnetic lens which focuses the beam to the desired spot size; the electron beam can be caused at the operator's discretion to weld, cut, or drill holes through various thicknesses of metal. The manner in which the foregoing may be accomplished and the apparatus for accomplishing the same are well known in the art and are described in Dr. Steigerwald's above-mentioned patent as well as in U.S. Patent No. 2,793,281, issued May 21, 1957, also to Dr. Steigerwald, wherein drilling holes with an electron beam is described.

Referring now to FIGURE 1, there is shown a circuit board 10 having a plurality of discrete terminal pads 12 formed on the surface thereof. Board 10 may be formed from glass, a ceramic material, or it may be a conventional polymeric board. Pads 12 may be any metallic material having a higher melting point than the solder that will form a tenacious bond with the surface of the particular board material and which may be applied to the surface of the board by any of several metalizing or plating processes such as gas plating, vacuum deposition or a silk screen process. Generally, vertical conductive paths are provided from pads 12 to the other side of the circuit board which has formed thereon conductive paths and thin film components by well-known printed circuit or vacuum deposition processes. Thus, the interconnecting paths to complete the electrical circuit which employs the individual circuit components to be attached to the upper side of board 10 will be formed on the back of the board. The individual circuit components are shown in FIGURE 1 as a transistor 13 and temperature independent resistors 14 and 15. It is the problem associated with the attachment of the leads extending from these components to the terminal pads with which this invention is concerned.

In FIGURE 2, a portion of a circuit board 10 is shown in cross section with a terminal pad 12 on the upper surface thereof. As mentioned above, pad 12 may be of any conductive material having a higher melting point than solder. For ceramic circuit boards, moly-manganese and gold-platinum are desirable pad base materials since they form a tenacious bond with ceramic materials and are resistant to damage from an electron beam. For polymeric boards, copper is an excellent pad material. Pad 12 may be applied to board 10 by any of several well-known methods including the printed circuit techniques, silk screen techinques, gas plating and vacuum deposition processes. In the case of most pad materials, with the exception of copper, formation of the pad is completed by plating the base material with a film of nickel or gold. These materials are plated over the pad base material by either electrolytic or electroless plating in order to reduce the electrical resistivity and increase thermal conductivity of the pad and also to provide a surface to which leads may be readily soldered. FIGURE 3 represents a moly-manganese pad 12 plated with a film of nickel 16. In all of FIGURES 2 through 7, a vertical feedthrough 18 is shown providing electrical contact between the pad 12 and the circuit on the bottom of the board. These feedthroughs may be fabricated by any of several methods known in the art. A typical method is drilling holes in the boards with ganged drills before fabricating the pads and then filling the holes with molten metal.

After the pads have been formed on the circuit board, the board is dip soldered to apply a coating of solder to the pads. The result of the dip soldering step is shown in FIGURE 4 where the solder is indicated by reference numeral 20. After dip soldering, the components are properly positioned on the board with their leads contacting individual terminal pads. In FIGURE 5, a lead 22 which may be a copper ribbon is shown in contact with the coating of solder 20 on a pad 12. Leads 22 may be held against the pads by a knife-edged fixture, not shown.

After fixturing, the board is placed on a tape controlled table in the vacuum chamber of an electron beam machine and, by positioning the movable table, a first component lead is aligned with the initial beam impingement point. Referring now to FIGURE 6, the beam will initially be gated off by a blocking voltage applied to a control electrode 24 in the electron beam machine by a bias control 26. Bias control 26 may be of a type well known in the art which is manually adjustable by the machine operator to normally provide a beam blocking voltage. When a positive pulse is applied to the control electrode from a pulse generator 28, the blocking bias is overcome and a control voltage of a magnitude that will allow the desired number of electrons to pass is generated. Both the magnitude and duration of these control pulses are manually controllable by means well known in the art. Thus, bias control 26 and pulse generator 28 operate together to gate the beam and to control the beam current. A variable electron acceleration voltage is applied between a directly heated cathode 30, which emits the electrons which form the working beam, and apertured anode 32. This accelerating voltage is generated by a high voltage source 34 and its magnitude is controlled by a potentiometer 36. The beam is focused at the point where a lead is to be joined to a terminal pad by a magnetic lens 38. The beam may be deflected to trace a desired pattern and/or be deflected to positions where it will impinge on subsequent leads by varying the current to magnetic deflection coils 40. Like the motion of the table which carries the board, the deflection of the beam may be programmed by means known in the art. In a typical application where .002 x .010 copper ribbons are to be soldered with a high temperature silver, lead and cadmium solder having a melting point of 400° C. to moly-manganese terminal pads having a nickel coating thereon, the beam accelerating voltage is set at 90 kv. and the output of pulse generator 28 is adjusted to provide a bias voltage that will result in a beam current of .35 milliampere. The adjusting of the accelerating and bias voltages is known in the art as controlling the beam power density. Once the beam power density is adjusted to provide the optimum working parameters, the operator will activate pulse generator 28 which, for the example being described, is set to provide a 16-microsecond pulse. It has been found that excellent results are achieved by utilizing a two shot soldering process. That is, two successive 16 microsecond pulses of the electron beam have produced an extremely strong solder joint while limiting the thermal energy transferred to the pad and lead. However, good results may also be achieved by use of a single pulse of duration longer than 16 microseconds. When these pulses are applied to control electrode 24, the beam will be gated on and will impinge upon lead 22. Under the operating conditions described, the beam will drill a hole in lead 22 and melt the solder 20 on the surface of pad 12. Since the operation is carried out in a vacuum, the solder will, due to capillary action, flow up the hole drilled by the beam and will wet the top surface of lead 22. FIGURE 7 depicts the finished solder joint. Pull tests of the joint depicted in FIGURE 7 and produced under the example conditions above showed an average breaking strength equal to the breaking strength of the lead itself. This is an increase in shear strength of better than 35% over the best prior art joining method.

It should be noted that in prior art soldering processes it was necessary to use flux since solder is very susceptible to oxidization when heated. Lack of or insufficient flux resulted in poor solder joints while proper amounts of flux resulted in a very time consuming process of removing the flux after the joining was accomplished. Since the soldering process of this invention is performed in a vacuum, it is not necessary to use flux. Another advantage realized by use of this invention is that less heat is required to produce a reliable joint. That is, approximately one-half the thermal energy is released in using the electron beam in accordance with this invention as a soldering tool than would be released to join the same materials using the electron beam as a welding tool. This, of course, reduces annealing of the copper leads, reduces the possibility of damaging the terminal pads, and eliminates vapor deposition which normally occurs during electron beam welding.

While a preferred embodiment has been shown and described, various modifications and substitutions may be made without deviating from the scope and spirit of this invention. For example, tools other than an electron beam may be utilized in the practice of this invention. A notable example of such other tools is a laser. Thus this invention is described by way of illustration rather than limitation and accordingly it is understood that this invention is to be limited only by the appended claims taken in view of the prior art.

I claim:

1. A method of attaching active and passive electronic circuit components to circuit boards having metalized terminal pads thereon comprising:
- applying a coating of conductive material having a lower melting point than the terminal pads to at least some of such pads on a board,
- positioning the individual circuit components on the board such that at least portions of the individual leads extending from the components contact respective individual coated terminal pads,
- locating the board generally in the path of a highly energized beam in such a position that the beam will impinge upon a first lead where it contacts a pad,
- adjusting the apparatus which generates the beam so that a beam having sufficient energy to produce holes in the leads will be generated,
- gating the beam generating apparatus on for a period sufficient to produce a capillary hole in the first lead and melt the coating on the pad, and
- causing relative movement between the beam and the board during periods when the beam is not gated on to cause the beam to impinge upon other selected leads.

2. The method of claim 1 wherein the step of applying a metallic coating to the pads comprises:
- dip soldering the board to apply coating of solder to the terminal pads.

3. The method of claim 2 wherein the step of locating the board in the path of a highly energized beam comprises:
- placing the board in the vacuum chamber of an apparatus which produces a highly energized beam, and
- positioning the board in the vacuum chamber relative to the beam axis in a location that will permit the beam to impinge upon a first lead when energized.

4. The method of claim 3 wherein the step of placing the board in the vacuum chamber comprises:
- placing the board in the work chamber of an apparatus which generates an intense beam of electrons, and
- evacuating the chamber.

5. The method of claim 4 wherein the step of adjusting the beam generating apparatus such that a beam having sufficient energy to produce capillary holes in the leads is generated comprises:
- adjusting the electron accelerating voltage of the beam generating apparatus to a value between 75 and 100 kv., and
- adjusting the bias voltage of the apparatus to a value that will provide a beam current of from 30 to 40 ma.

6. The method of claim 5 wherein the step of gating the beam comprises:
- overcoming the blocking bias voltage on the beam generating apparatus for a period not exceeding 35 microseconds.

7. The method of claim 6 wherein the period during which the beam is gated on is divided into two periods.

8. A method of assembling a microminiaturized electronic circuit comprising:
- forming discrete terminal pads on a circuit board,
- providing conductive paths between at least some of the pads,
- dip soldering the board to apply a coating of low melting point conductive material to the pads,
- positioning individual electronic circuit components on the board with the leads extending therefrom contacting respective individual coated pads,
- causing a high energy beam of charged particles to impinge on a first lead where it contacts a pad for a period of time sufficient to permit the beam to drill a capillary hole in the lead and melt the coating, and
- gating the beam off while causing relative movement between the board and beam axis thereby permitting the beam to join subsequent leads to pads.

9. A method of joining two metallic members comprising:
- applying a coating of solder to a first member,
- positioning a second member in such a manner that at least a portion thereof contacts the coated surface of the first member,
- directing a high energy electron beam to impinge upon the exposed surface of the second member above a point on the portion thereof that contacts the first member,
- adjusting the beam power density to a value that will cause the beam to produce a capillary hole in the second member, and
- causing the beam to impinge upon the second member until the coating on the first member melts and flows up the beam produced capillary hole to wet the exposed surface of the second member.

10. A method of soldering comprising:
- applying a coating of solder to a first member,
- positioning a second member in such a manner that at least a portion thereof contacts the coated surface of the first member, drilling a capillary hole in the second member where it contacts the coating on the first member, applying heat to melt the solder on the first member, and halting the application of heat when the melted solder has flowed up the capillary hole in the second member and wet the upper surface thereof.

References Cited by the Examiner

UNITED STATES PATENTS

| | | | |
|---|---|---|---|
| 2,522,329 | 9/1950 | Wolff | 29—503 X |
| 2,989,618 | 6/1961 | French et al. | 219—91 X |
| 3,069,187 | 12/1962 | Collins et al. | 29—479 X |

JOSEPH V. TRUHE, *Primary Examiner.*